United States Patent [19]

Tanimoto et al.

[11] Patent Number: 4,699,515

[45] Date of Patent: Oct. 13, 1987

[54] PROCESS OF TRANSFER OF MASK PATTERN ONTO SUBSTRATE AND APPARATUS FOR ALIGNMENT THEREBETWEEN

[75] Inventors: Akikazu Tanimoto, Yokohama; Toshio Matsuura, Koshigaya; Kyoichi Suwa, Yokohama, all of Japan

[73] Assignee: Nippon Kogaku K. K., Tokyo, Japan

[21] Appl. No.: 705,699

[22] Filed: Feb. 26, 1985

[30] Foreign Application Priority Data

Feb. 28, 1984 [JP] Japan .................................. 59-36793
Mar. 6, 1984 [JP] Japan .................................. 59-42472

[51] Int. Cl.$^4$ ............................................. G01B 11/00
[52] U.S. Cl. ..................................................... 356/40
[58] Field of Search ................................ 356/400, 401

[56] References Cited

U.S. PATENT DOCUMENTS

| | | | |
|---|---|---|---|
| 4,057,347 | 11/1977 | Moriyama et al. | 356/401 |
| 4,362,389 | 12/1982 | Koizumi et al. | 356/401 |
| 4,385,838 | 5/1983 | Nakazawa et al. | 356/401 |
| 4,423,959 | 1/1984 | Nakazawa et al. | 356/400 |

*Primary Examiner*—R. A. Rosenberger
*Assistant Examiner*—Crystal D. Cooper
*Attorney, Agent, or Firm*—Shapiro and Shapiro

[57] ABSTRACT

In an exposure apparatus for manufacturing semiconductor devices, a pattern on a photomask is aligned with a plurality of patterns formed on a wafer in a manner that detects and corrects misalignment, including, inter alia, rotational errors, not only between a photomask and a wafer, but also between a photomask and individual chips formed on the wafer, so that pattern matching is attained with very high accuracy. Apparatus for achieving this result employs different arrangements of alignment marks together with optical systems and positional adjustment devices.

17 Claims, 26 Drawing Figures

PROCESS OF TRANSFER OF MASK PATTERN ONTO SUBSTRATE AND APPARATUS FOR ALIGNMENT THEREBETWEEN

BACKGROUND OF THE INVENTION

1. Field of the Invention

The present invention relates to an exposure apparatus for manufacturing semiconductor devices such as IC or LSI, and more particularly to alignment between a photomask and a semiconductor substrate, and to a photomask having reference marks for said alignment.

2. Description of the Prior Art

In modern semiconductor device manufacture there have widely been employed so-called step-and-repeat apparatus for repeatedly exposing a semiconductor wafer to a circuit pattern of a mask. Particularly an exposure apparatus for transferring the circuit pattern of the mask onto the wafer through a reducing projection lens is highly productive as it can achieve exact pattern superposing despite dimensional change of the wafer in various process steps, since the circuit pattern of the mask is superposed onto each of plural patterns already formed on the wafer. Such exposure apparatus is equipped with a two-dimensionally movable stage for supporting the wafer, and the exposure is repeated by stepping said stage by a determined pitch along a determined coordinate system with respect to the image of the circuit pattern of the mask, whereby the circuit patterns are arranged in a matrix on the wafer.

The coordinate of arrangement of the circuit patterns on the wafer coincides with the coordinate system of the stage during the exposure operation, but, when the wafer is exchanged, there is generated a rotational aberration or deviation between the coordinate of arrangement on said wafer and that of the stage.

Said rotational aberration can be corrected by the rotation of wafer, but there still remains a slight rotational aberration. Said slight rotational aberration between the coordinate of arrangement on the wafer and the coordinate system of the stage is generally called wafer rotation. For achieving more precise superposing, there is already proposed a method for correcting the wafer rotation as disclosed in the U.S. Pat. No. 4,385,838 issued May 31, 1983, and the wafer rotation can be corrected by such known method.

However the slight rotational aberration of the reticle or the photomask becomes significant as the size of the circuit pattern to be transferred onto the wafer becomes larger and the line width reaches an order of 1 $\mu$m. Such slight rotational aberration of the reticle not only deteriorates the precision of superposing onto the circuit patterns on the wafer but also results in an unsatisfactory superposing of the second and ensuing layers since the circuit pattern of the first layer transferred onto the wafer is slightly rotated with respect to the coordinate system of arrangement on the wafer, so that it becomes impossible to obtain semiconductor devices of the desired performance at a high productivity.

SUMMARY OF THE INVENTION

An object of the present invention is to provide a pattern transferring process capable of minimizing the relative rotational aberration or deviation between the photomask and the semiconductor wafer, thus enabling high precise superposing.

Another object of the present invention is to provide an exposure apparatus for exercising the above-mentioned process.

Still another object of the present invention is to provide a photomask enabling rapid and precise measurement of rotation of plural pattern chips arranged in matrix on a semiconductor wafer with respect to the wafer.

DESCRIPTION OF THE PREFERRED EMBODIMENT

Figure 1:
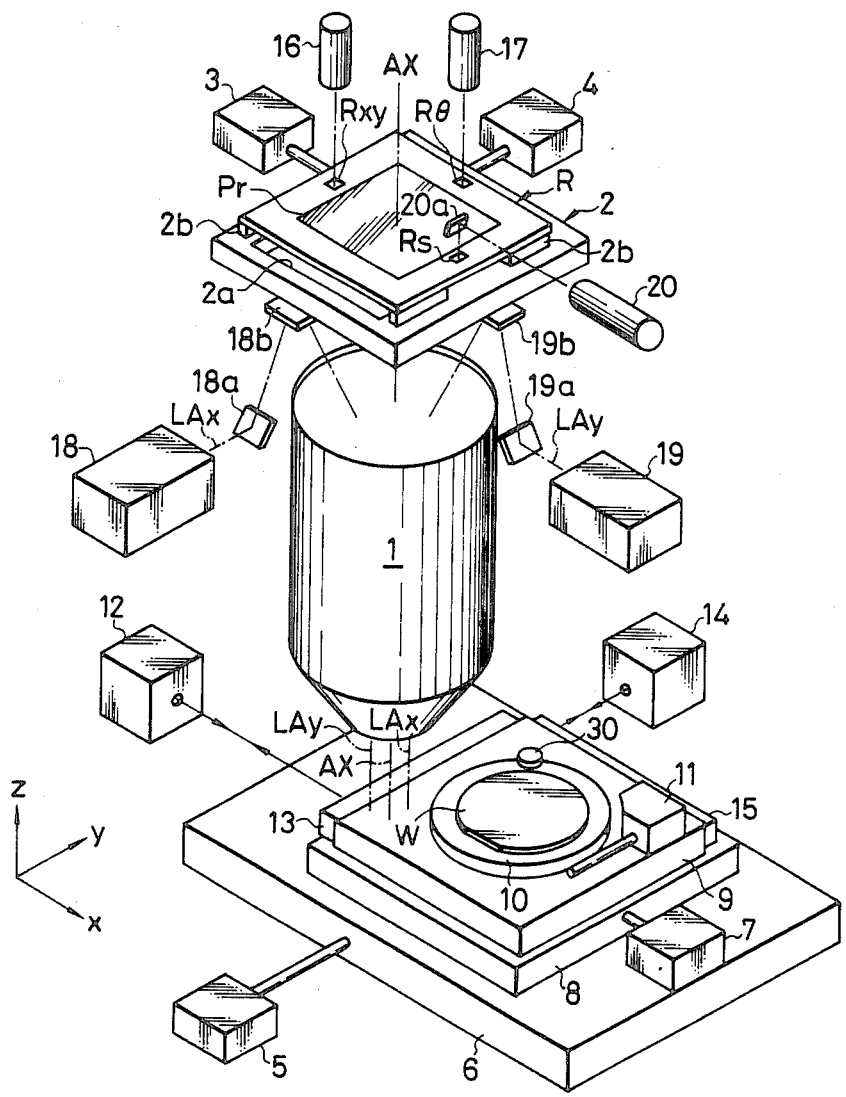
FIG. 1 is a perspective view schematically showing the structure of a projection exposure apparatus embodying the present invention.
Figure 2:
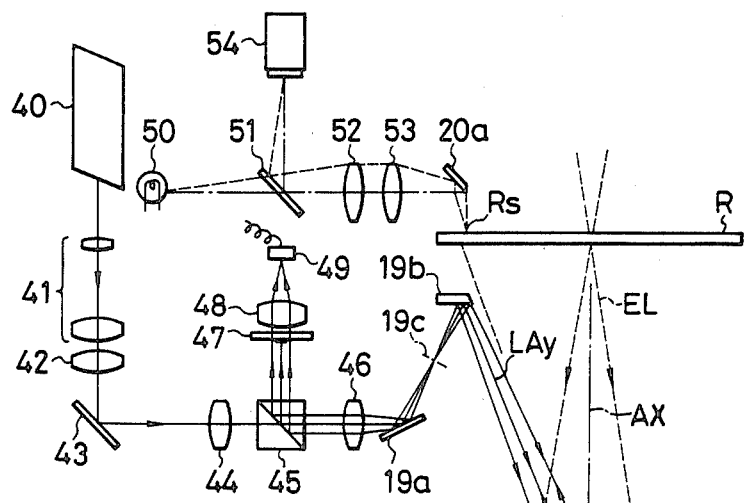
FIG. 2 is an optical arrangement diagram of a laser stepping alignment system.

At first the structure of a reduced projection exposure apparatus will be briefly explained in relation to FIGS. 1 and 2.

A reticle (or photomask) R bearing a determined pattern composed of transparent areas and opaque areas is uniformly illuminated by the light EL (FIG. 2) of a wavelength actinic to a photosensitive material coated on a wafer W, whereby the optical image of a pattern area Pr of the reticle R is projected onto the wafer W through a projection lens 1. The reticle R is placed on a reticle stage 2, which is provided with an aperture 2a for guiding the light passing through the pattern area Pr into the projection lens, and a supporting area 2b for supporting, by suction, the peripheral area of the reticle. Actuators 3, 4 slightly move the reticle stage respectively in x- and y-directions, thus performing two-dimensional positioning of the reticle, including the rotation thereof.

A two-dimensionally movable stage (hereinafter called wafer stage) is composed of a Y-stage 6 movable in the y-direction by an actuator 5, an X-stage 8 movable in the x-direction by an actuator 7 on said Y-stage, a Z-stage 9 vertically movable in the z-direction with respect to said x-stage, and a wafer holder 10 capable of fixing the wafer W by suction and performing slight rotation by an actuator 11. The Z-stage 9 performs the vertical movement by an actuator (not shown) provided on the X-stage 8. In order to detect the position of the wafer stage, there are provided an optical interferometer 12 utilizing a laser beam, and mirrors 13, 15 positioned on the edges of the Z-stage 9.

Said exposure apparatus is basically provided with four optical and detecting systems for alignment. The first system consists of two reticle alignment microscopes (hereinafter written as R-MIC) 16, 17 for aligning the reticle R with respect to the main body of the apparatus, for example optical axis AX of the projection lens 1. The R-MIC 16 observes a reticle mark Rxy provided in the periphery of the pattern area Pr of the reticle, while the R-MIC 17 observes a reticle mark R$\theta$ provided at a different position in the periphery of the pattern area Pr. The positioning of the reticle in the x- and y-directions is achieved by controlling the actuators 3, 4 so as to match the reticle mark Rxy with an index mark in the R-MIC 16, and the rotational positioning is achieved by controlling said actuators 3, 4 so as to match the reticle mark R$\theta$ with an index mark in the R-MIC 17. Said R-MIC's 16, 17 may be utilized for positioning under visual observation, or for automatic positioning by photoelectric detection of the reticle marks Rxy, R$\theta$.

The second alignment system consists of two laser step alignment systems (hereinafter written as LSA system) 18, 19 for detecting determined marks on the wafer (wafer marks) with a laser beam by through-the-lens method (TTL method) to align the wafer with respect to the apparatus. The LSA system 18 projects a laser beam LAx to which the photoresist on the wafer is sensitive, (for example obtained from a helium-neon laser) onto a mirror 18a perpendicularly to the optical axis AX, and said mirror 18a directs said laser beam LAx upwards. A mirror 18b, having a reflecting face parallel to the lower face of the reticle and separated by a determined distance from said lower face, reflects the laser beam from the mirror 18a toward the center of the entrance pupil of the projections lens 1. In the present embodiment it is assumed that the projection lens constitutes a nontelecentric optical system at the reticle size and a telecentric optical system at the wafer side. As the mirror 18b is positioned around the reticle apart from the optical axis AX, the optical axis of the laser beam LAx becomes inclined by a determined angle with respect to the optical axis AX. However, at the wafer side of the projection lens, said optical axis LAx of the laser beam becomes parallel to the optical axis AX. Another set of LSA system 19 and mirrors 19a, 19b is provided in a similar manner at a position 90° distant spatially from the LSA system 18 and mirrors 18a, 18b with respect to the optical axis AX, and directs a laser beam LAy into the projection lens. Said two LSA systems 18, 19 detect the alignment marks of x- and y-directions provided on the wafer without transmission of light through the reticle, thus achieving the alignment of a local area of the wafer.

The third alignment system consists of a die-by-die alignment (DDA) system 20 for observing a mark Rs on the reticle and a mark on the wafer in superposed manner through the projection lens. The DDA system 20 projects, onto the mark Rs, a light beam of a wavelength the same as that of the exposing light beam, by perpendicular reflection by a mirror 20a. The illuminating light from the mirror 20a not only illuminates said mark Rs but also a small area including the mark on the wafer through the projection lens. The image of the wafer mark inversely projected through the projection lens and the image of the reticle mark Rs are reflected by the mirror 20a and formed by the DDA system 20, thus enabling the detection of alignment of the pattern area Pr of the reticle and a local area to be exposed on the wafer. Also said DDA system 20 may be employed in visual observation or in automatic alignment by photoelectric detection of the marks with a slit-scanning photoelectric microscope or an image sensor. In such die-by-die alignment system, when the projected image of the pattern area Pr of the reticle is exactly aligned with a local area of the wafer, the wafer mark and the reticle mark Rs are arranged in a determined positional relationship and observed in the DDA system 20. Consequently the exposure operation can be immediately started after the alignment is achieved under the DDA system through fine movements of the wafer stage and reticle stage. It is assumed that the DDA system 20 of the present embodiment is adapted to detect positional aberration in the y-direction of the images of the reticle mark and wafer mark.

The final alignment system consists, as shown in FIG. 2, of two wafer alignment microscopes (W-MIC) 21, 22 of the off-axis type spaced by determined distances from the projection lens 1. Said W-MIC's 21, 22 are provided at predetermined positions and are adapted to detect marks provided in representative positions of the wafer, thereby achieving global alignment of the wafer with respect to the apparatus.

A reference mark plate 30 is provided on the wafer holder 10 for use in the aforementioned alignment of reticle, global alignment of the wafer and alignment of a local area of the wafer (hereinafter called step alignment), and in the adjustment of the optical and detecting systems. Said reference mark plate 30 is composed of a glass substrate covered with a reflective chromium layer in which necessary marks are formed by etching.

FIG. 2 shows the construction of the LSA and DDA systems, in which the LSA system 19 alone is shown for brevity but the structure is the same also for the LSA system 18. A laser beam emitted from a laser unit 40 such as a helium-neon laser is expanded to a determined cross section by a beam expander 41, and is reformed to a rectangular cross section by a cylindrical lens 42. The laser beam thus reformed is reflected by a mirror 43 and reaches the mirror 19a through a lens 44, a beam splitter 45 and a lens 46. After reflection by said mirror 19a, it passes a diaphragm 19c, is reflected by a mirror 19b and proceeds toward the center of the entrance pupil 1a of the projection lens. Said diaphragm 19c is provided at the focus position of the laser beam reflected by the mirror 19a. At said focus position the laser beam is converged into a stripe-shaped spot extending perpendicularly to the plane of illustration. Said laser beam passes the center of the entrance pupil 1a of the projection lens 1, and is focused as an oblong spot on a focal plane FP thereof.

The mirror 19b is so positioned as not to intercept the projection light path of the pattern. Also the surface of the reference mark plate 30 coincides with said focal plane FP. Said reference mark plate 30 bears a grating mark for generating diffracted light upon illumination by a light spot. Said grating mark consists of a regular array of small linear elements, of which the direction of the array coincides with the elongated direction of the light spot. When the light spot falls on the grating mark, there is generated higher-order diffracted light in addition to the normally reflected light (zeroeth-order diffracted light). Such diffracted light inversely follows the light path of the laser beam LAy through the projection lens 1 and reaches a spatial filter 47 after being reflected by the beam splitter 45. Said spatial filter 47 intercepts the normally reflected light but transmits other higher-order diffracted light. A condenser lens 48 concentrates the higher-order diffracted light transmitted by the spatial filter 47 onto a photoelectric detector 49.

The DDA system 20 is provided with a light source 50 for generating an illuminating light beam of a wavelength the same as that of the exposing light, a beam splitter 51 for transmitting said illuminating light, a second objective lens 52 for converting said illuminating light beam into a parallel light beam, a first objective lens 53 for converting said parallel illuminating light, and an imaging tube 54 for receiving the image of the reticle mark Rs reflected by the beam splitter 51. In such structure, the illuminating light emerging from the first objective lens 53 is reflected by the mirror 20a to illuminate the mark Rs and also illuminate the mark on the reference mark plate 30 or the wafer mark through the projection lens 1. The light reflected from said mark again passes through the projection lens 1 and reaches a light-receiving face of the imaging tube 54 through the mark Rs of the reticle, mirror 20a, lenses 53, 52 and beam splitter 51. In this manner, on the light-receiving face of the imaging tube 54, there are formed an image of the mark Rs, and an enlarged image of the mark of the reference mark plate 30 or of the wafer W through the projection lens 1.

Figure 3:
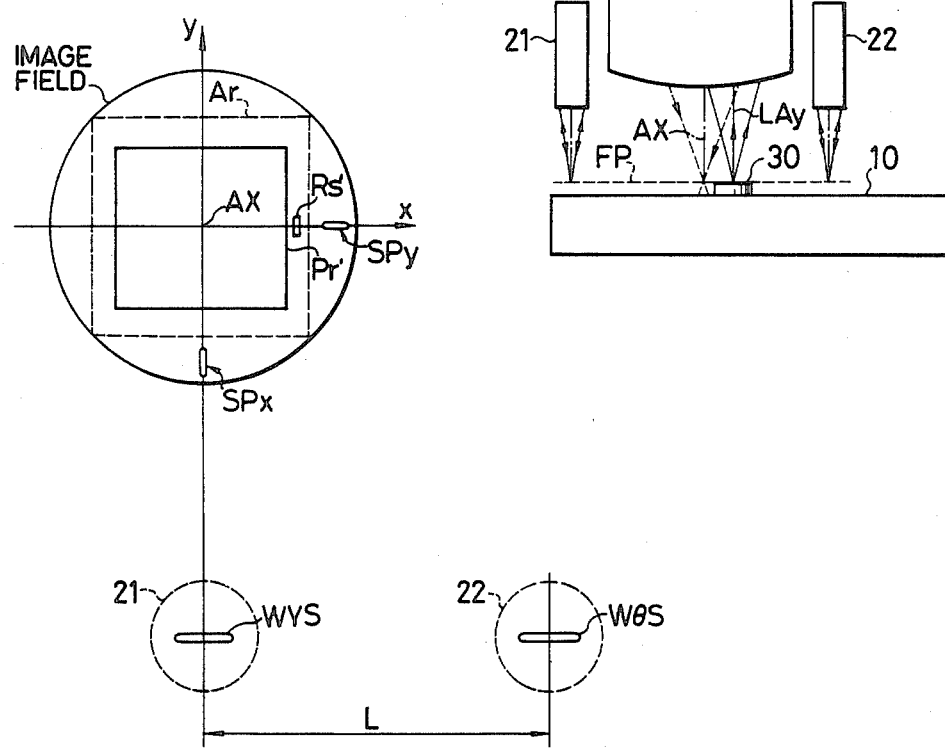
FIG. 3 is a schematic view showing the arrangement of the image field of the projection lens and light spots.

FIG. 3 shows the positional relationship of a light spot SPx formed by the laser beam LAx of the LSA system 18 and a light spot SPy formed by the laser beam LAy of the LSA system 19 on the focal plane FP, together with a projected image Rs' of the reticle mark Rs. The circular area represents the maximum image field projectable by the projection lens 1, and the rectangular area Pr' represents an area of projection of the pattern area Pr of the reticle. The optical axis AX of the projection lens passes the center of the image field, and the center of the rectangular area Pr' coincides with the optical axis AX. When the moving coordinate system of the wafer stage, or the x- and y-axes of the x-y coordinate system, is defined with said center as the origin point, the light spot SPx formed by the LSA system 18 is extended along the y-axis while the light spot SPy formed by the LSA system 19 is extended along the x-axis. The distances of the light spot SPx in the y-direction from the a-axis and that of the light spot SPy in the x-direction from the y-axis are determined in advance at the manufacture of the apparatus, in such a manner that said light spots SPx, SPy are positioned inside the image field and outside a rectangular area Ar internally tangential to said image field. Said area Ar represents a maximum area projectable by the projection lens 1 in the rectangular form.

As disclosed in the U.S. Pat. No. 4,423,959 issued Jan. 3, 1984, the off-axis W-MIC's 21, 22 illuminate grating marks formed on the wafer with oblong spots of laser beams and photoelectrically detect the diffracted light from said marks, thus detecting the positional aberrations of the wafer with respect to the W-MIC's 21, 22. Said oblong spots are so adjusted in advance so as to be focused on the focal plane FP.

Figure 4:
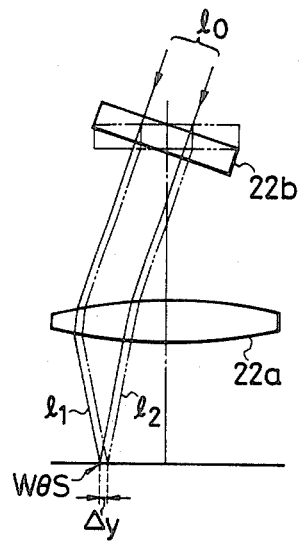
FIG. 4 is a schematic view showing the arrangement of a halving glass.

When the original point of the x-y coordinate system is made to coincide with the optical axis AX, the W-MIC 21 is positioned on the y-axis with a determined distance from the optical axis AX, and the oblong light spot WYS of the W-MIC 21 is elongated in the x-direction. On the other hand, the W-MIC 22 generates a light spot W$\theta$S elongated in the x-direction, and is so positioned that the center of the light spot W$\theta$S in the x-direction is spaced by a distance L from the center of the light spot WYS in the x-direction. There is also provided a device for adjusting the illuminating position of the light spot W$\theta$S in the y-direction in such a manner that a line connecting the light spots WYS and W$\theta$S becomes parallel to or forms a determined angle with the x-axis. More specifically the W-MIC 22 receives, as shown in FIG. 4, a parallel laser beam 10 and converges said light beam into the light spot W$\theta$S. In this operation, the laser beam 10 entering an objective lens 22a is shifted within a determined angle range by a parallel flat glass 22b, which will hereinafter be called halving glass. Consequently the light beam 10 is deviated as shown by beams 11, 12, and the light spot W$\theta$S is displaced within a range $\Delta y$ in the y-direction.

The distance L between the light spots WYS and W$\theta$S is so selected as to allow simultaneous detection of marks provided in two representative locations on the wafer. Stated differently, two marks on the wafer are mutually distanced by L so as to enable detections by the W-MIC's 21, 22 at the same time. Said two marks have grating patterns extended in the x-direction and are used for detecting the positional aberration of the wafer in the y-direction with respect to the light spots WYS, W$\theta$S.

Figure 5:
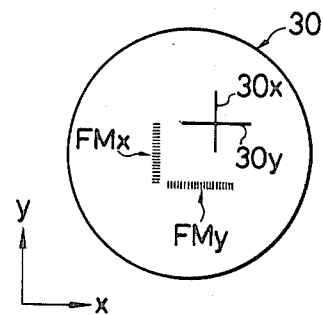
FIG. 5 is a plan view of a reference mark plate.

FIG. 5 shows the mark pattern on the reference mark plate 30. Said plate 30 is provided with grating marks FMx, FMy respectively parallel to the y- and x-axes, and mutally crossing linear marks 30x, 30y respectively parallel to the y- and x-axes. The marks FMx, FMy generate diffracted light in response to the light spots SPx, SPy of the LSA systems 18, 19 or the light spots WYS, W$\theta$S of the W-MIC's 21, 22 and are used for adjustment of the LSA systems 18, 19 and the W-MIC's 21, 22 and for various measurements. Also the marks 30x, 30y are used for adjustment of the R-MIC's 16, 17 and the DDA system 20 and for various measurements.

Figure 6:
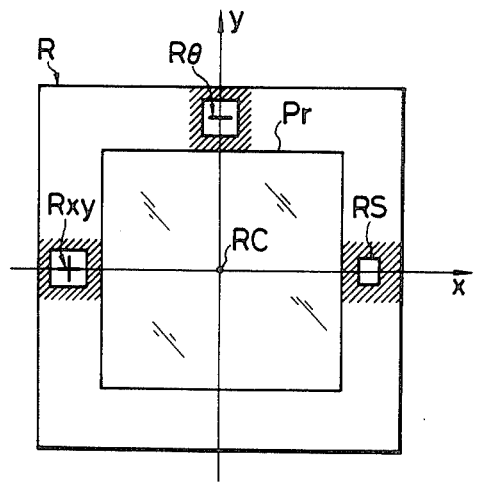
FIG. 6 is a plan view of a reticle for transferring the pattern of a second layer.
Figure 7:
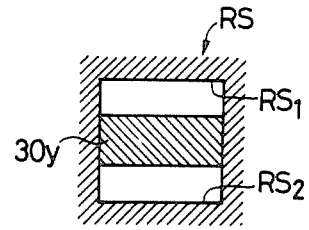
FIG. 7 is a view of a mark 30y of the reference mark plate observed through a window RS of the reticle.

FIG. 6 shows an arrangement of the marks on the reticle suitable for use in the present embodiment. The x-y coordinate system is so determined that the origin point falls on the center RC of the pattern area Pr of the reticle R. If the reticle is not rotated with respect to said x-y coordinate system, the mark Rxy composed of a cross-line pattern is positioned on the x-axis, and the mark R$\theta$ composed of a linear pattern extending in the x-direction is positioned on the y-axis. Naturally the distances of the marks Rxy, R$\theta$ from the center Rc are determined in advance in relation to the design of the reticle. On the x-axis and opposite to the mark Rxy there is provided a mark RS, consisting of a rectangular translucent window formed in an opaque area and having two edges RS1, RS2 parallel to the x-axis as shown in FIG. 7. FIG. 7 shows a state in which said window RS and the mark 30y of the reference mark plate 30 are superposed through the DDA system 20, and the alignment of the wafer stage and the reticle is achieved when the distance between the edge RS1 and the mark 30y becomes equal to that between the edge RS2 and the mark 30y.

Figure 8:
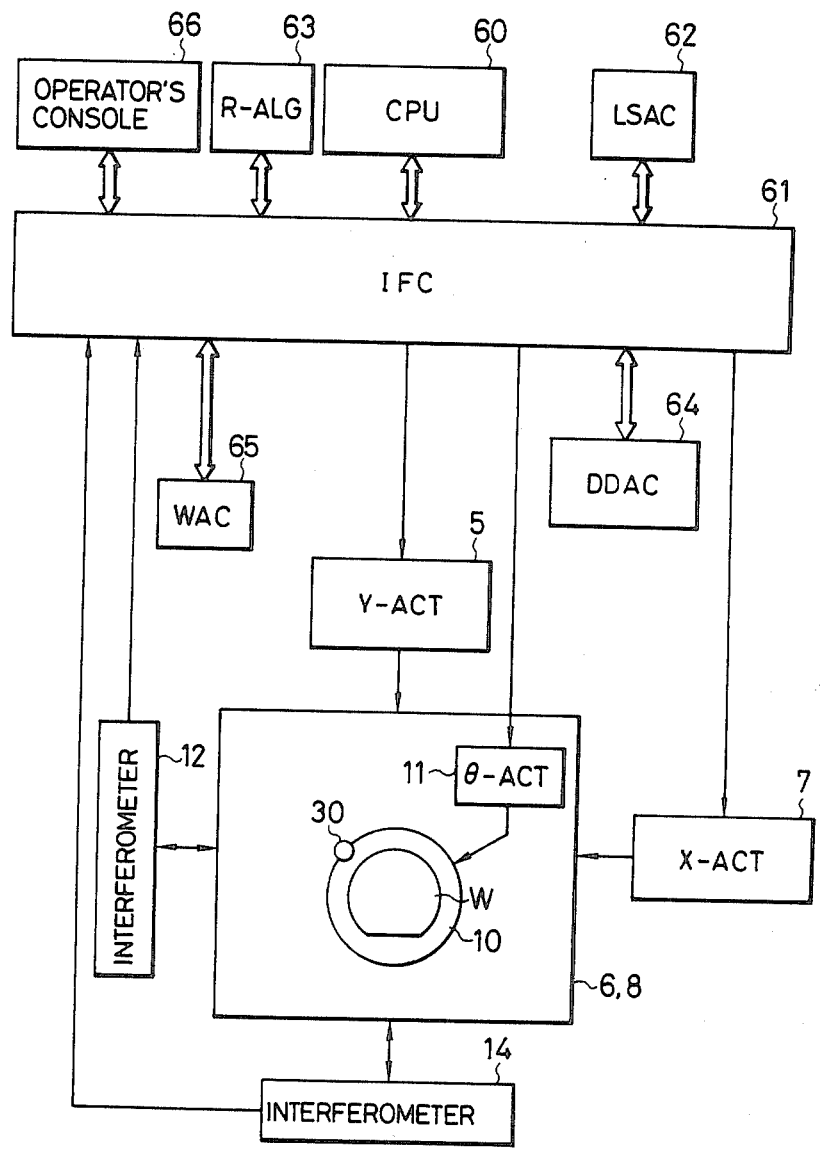
FIG. 8 is a block diagram of a control system for use in the present embodiment.

FIG. 8 shows a control circuit for use in the present embodiment, wherein a processor (hereinafter called CPU) 60 such as a microcomputer or a minicomputer controls the function of the entire apparatus through an interface circuit (IFC) 61. A laser step alignment control circuit (LSAC) 62 detects the positional intensity distribution of the diffracted light from the marks in response to a photoelectric signal from a photoelectric detector 49 of the LSA system shown in FIG. 2, and positional information from laser interferometers 12, 14, for example an up-count or down-count pulse generated at each unit movement (0.02 $\mu$m) of the two-dimensionally movable stage, and determines the positions of said marks with respect to the light spots SPx, SPy. The photoelectric signal corresponding to the diffracted light from the mark in response to the light spot SPx is sampled in response to the up-down pulses of the laser interferometer 12, and the photoelectric signal corresponding to the diffracted light from the mark in response to the light spot SPy is sampled in response to the up-down pulses of the laser interferometer 14.

A reticle alignment system control circuit (R-ALG) 63 photoelectrically detects the marks Rxy, R$\theta$ in cooperation with the R-MIC's 16, 17 shown in FIG. 1 to calculate the positional aberrations of said marks with respect to the index marks in the R-MIC's 16, 17, and applies feedback control to the actuators 3, 4 of the reticle stage so as to cancel thus calculated amounts. The R-MIC's 16, 17 can also detect the marks 30x, 30y of the reference mark plate 30 (or the marks FMx, FMy) through the projection lens 1, and in response the R-ALG 63 determines the positional aberrations of the marks 30x, 30y with respect to the index marks of the R-MIC's 16, 17 and transmits the obtained results to the CPU 60 through the IFC 61. A die-by-die alignment system control circuit (DDAC) 64 photoelectrically detects the images of the mark of the wafer or the mark 30y of the reference mark plate 30 and the mark RS of the reticle in cooperation with the DDA system 20 shown in FIG. 1, and determines the relative positional aberration of said marks in the y-direction.

A wafer alignment system control circuit (WAC) 65 determines the positional aberration of the wafer marks in the y-direction with respect to the light spots WYS, W$\theta$S, in response to the photoelectric signals from the W-MIC 21, 22 shown in FIG. 2. The WAC 65 also has a function of rotating the halving glass 22b in response to an instruction from the CPU.

The CPU 60 supplies instructions, through the IFC 61, to the actuator 7 (X-ACT) for the wafer stage in the x-direction, the actuator 5 (Y-ACT) in the y-direction, and the actuator 11 ($\theta$-ACT) for rotating the wafer holder 9, and the amount of actuation is determined by the calculation in the CPU in response to the positional aberrations determined in various control circuits. An operation panel 66, functioning as a man-machine interface for the CPU, is provided for enabling the operator to enter instructions and for displaying the status of the apparatus. The IFC 61 is provided with an X-counter (not shown) for reversibly counting the up-down pulses from the laser interferometer 12 and a Y-counter (not shown) for reversibly counting the up-down pulses from the laser interferometer 14, and the CPU reads the counts of said X- and Y-counters to detect the two-dimensional position of the wafer stage in the x-y coordinate system. In this manner the positional detection and the positioning of the wafer stage by the CPU are always conducted in reference to the x-y coordinate system.

Figure 9:
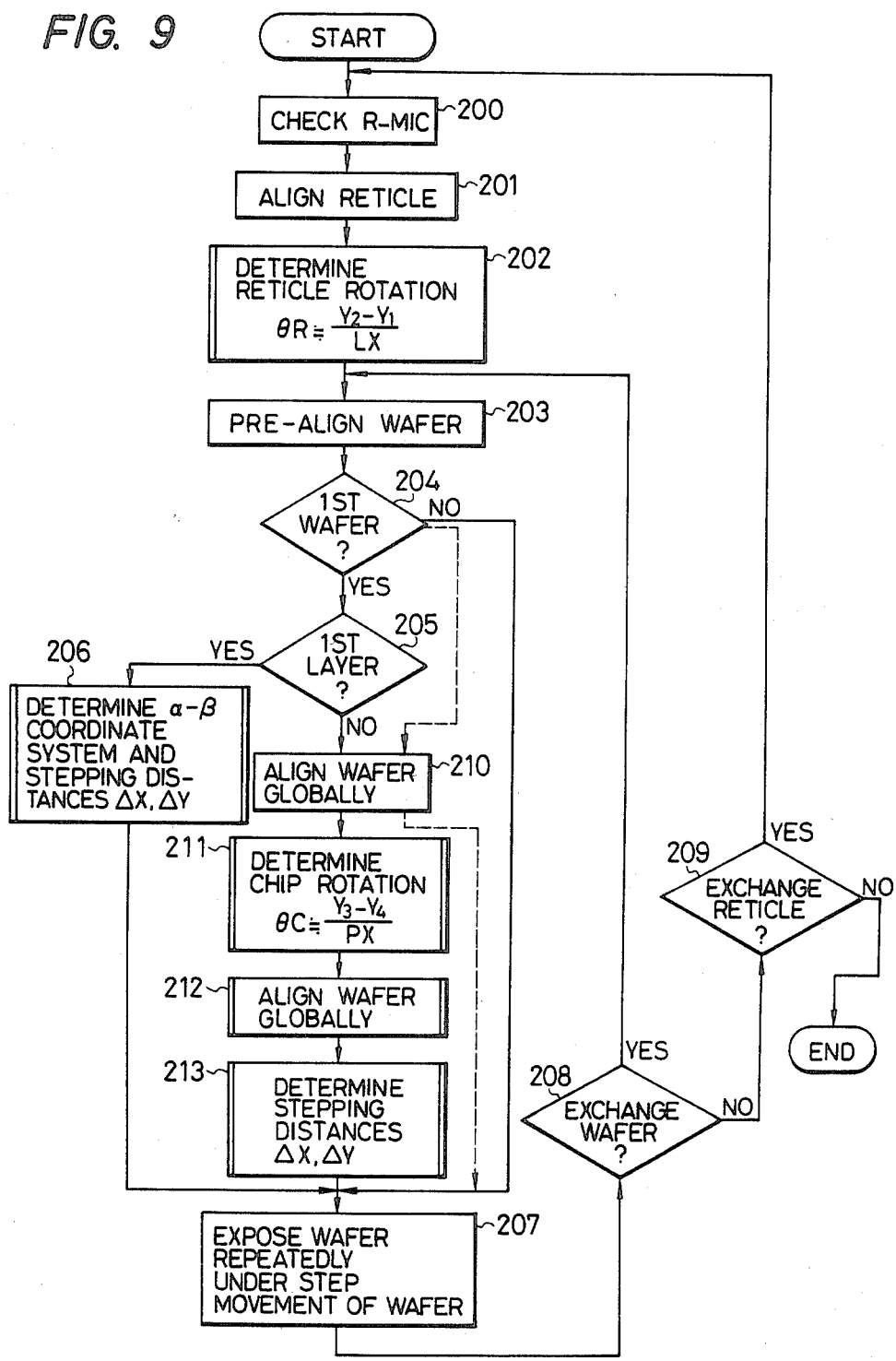
FIG. 9 is a flow chart showing the function of the present embodiment.

Now reference is made to a schematic flow chart shown in FIG. 9, for explaining the function of the present embodiment. FIG. 9 shows the basic sequence of operations from the alignment of the reticle and wafer to the exposure step. In the following there will be explained the procedure of transferring the circuit pattern of a first layer onto the wafer.

Step 200

Figure 10:
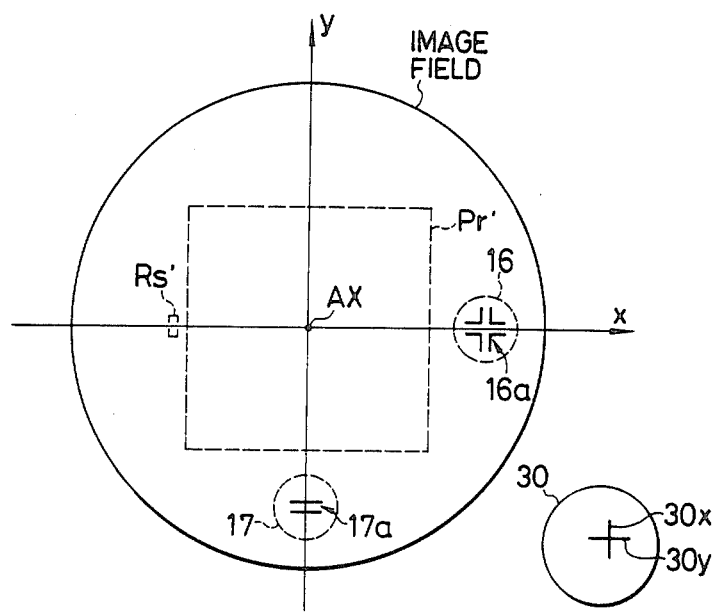
FIG. 10 is a plan view showing the arrangement of the image field and the reticle alignment microscope.

The projected position of the index mark of the R-MIC 16 is checked before the reticle is placed on the reticle stage 2. This operation will be explained in the following in relation to FIG. 10, showing the arrangement of the images 16a, 17a of the index marks of the R-MIC's 16, 17 projected in the image field of the projection lens and that of the reference mark plate 30. In the image field there are also shown a projected image RS' of the mark RS and a projected image Pr' of the pattern area Pr in a state where the reticle is correctly aligned without errors, including rotational error. The image 16a of the index mark has complementary shape matching the cross marks 30x, 30y of the reference mark plate 30 or the cross mark Rxy of the reticle, and image 17a has a complementary shape matching the mark R$\theta$ of the reticle or the mark 30y of the reference mark plate 30.

In this step 200, the position of the image 16a of the index mark in the y-direction is measured by the laser interferometer 14. For brevity of explanation, it is assumed that the wafer stage is placed at the origin point of the x-y coordinate system when the crossing point of the marks 30x, 30y is positioned at the optical axis AX, and that the X- and Y-counters in the IFC 61 are so adjusted in advance that the counts thereof are both zero in this state. The center of the image 16a does not always fall on the x-axis because of a time-dependent drift or an error in the precision. Therefore, after moving the wafer stage from the position of the origin point in the x-direction, the CPU activates the X-ACT 7 and Y-ACT 5 in such a manner that the marks 30x, 30y are aligned with the image 16a by the R-ALG 63. After said alignment, the CPU memorizes the value Y1 of the y-coordinate of the wafer stage, i.e. the count of the Y-counter.

Step 201

Figure 11:
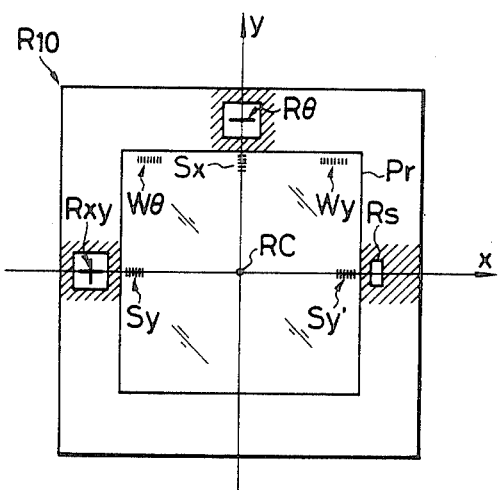
FIG. 11 is a plan view of a reticle for transferring the pattern of a first layer.

After the reticle is loaded on the reticle stage and fixed by suction, the CPU moves the reticle stage slightly to align the reticle, by activating the actuators 3, 4 through the R-ALG 63 in such a manner that the image 16a coincides with the mark Rxy of the reticle and the image 17a coincides with the mark Rθ of the reticle. After said reticle alignment, the reticle stage is fixed by suction to a support (not shown). As shown in FIG. 11, the reticle R10 of the first layer is provided with marks Wy, Wθ, Sx, Sy, Sy' for wafer alignment and laser step alignment for use in the exposure for second and ensuing layer. The marks Wy, Wθ are composed of grating patterns extended linearly in the x-direction and are positioned parallel to the x-axis in two positions on the reticle R. The mark Sx is composed of a grating pattern extended on the y-axis, and the marks Sy, Sy' are composed of grating patterns extended on the x-axis and are positioned across the center RC.

Step 202

Then the CPU measures the remaining rotational error of the reticle, i.e. the reticle rotation. At first the wafer stage is moved to a position where the image 16a of the index mark coincides with the marks 30x, 30y, wherein the wafer stage is so positioned that at least the position in the y-direction reaches the previously memorized coordinate value Y1. Then the CPU moves the wafer stage in the x-direction until the marks 30x, 30y coincide with the projected image Rs' of the reticle mark RS, while maintaining the y-coordinate value Y1. The image Rs' overlaps with the mark 30y and is observed by the DDA system 20 as shown in FIG. 7. In this state the reticle rotation is equal to zero if the mark 30y is positioned at the exact center between the edges RS1 and RS2. In practice, however, there remains a slight reticle rotation. Consequently the positional aberration between the mark RS and the mark 30y in the y-direction is detected by the DDA system 20 and DDAC 64, and the wafer stage is moved slightly in the y-direction so as to cancel said aberration. Then the CPU memorizes the y-coordinate value Y2. The amount of reticle rotation θR with respect to the x-y coordinate system is given by:

$$\theta R = \tan^{-1}\left(\frac{Y_2 - Y_1}{LX}\right) \quad (1)$$

wherein LX is the distance of movement of the wafer stage from the center of the image 16a to the projected image Rs'. As the reticle rotation θR is very small, it can be approximated by the following equation:

$$\theta R = \sin^{-1}\left(\frac{Y_2 - Y_1}{LX}\right) \cong \frac{Y_2 - Y_1}{LX} \quad (2)$$

It represents the inclination of a line connecting the center of the mark Rxy and the center of the mark RS, with respect to the x-axis. The measurement of reticle rotation is completed in this manner.

Step 203

Then the CPU 60 places the wafer on the wafer holder 10 by controlling a conveyor (not shown). In this operation the wafer is pre-aligned in such a manner that a flat, a linear cut-off portion provided on the periphery of the wafer, becomes parallel to the x-axis.

Step 204

Then the CPU identifies whether the wafer to be exposed is the first wafer in a lot, consisting of plural wafers subjected to the same process in the semiconductor device manufacture. The wafers in a lot generally show less fluctuation in quality.

The CPU then executes the next step 205, assuming that the wafer to be exposed is the first wafer in the lot.

Step 205

The CPU identifies whether the pattern to be exposed is that for the first layer. Since the reticle R10 for the first layer has been loaded in the present case, the CPU executes the next step 206.

Step 206

The CPU performs such corrective calculation as to incline the stepping coordinate of the wafer stage in the step-and-repeat process by the reticle rotation θR with respect to the x-y coordinate system.

Figure 12:
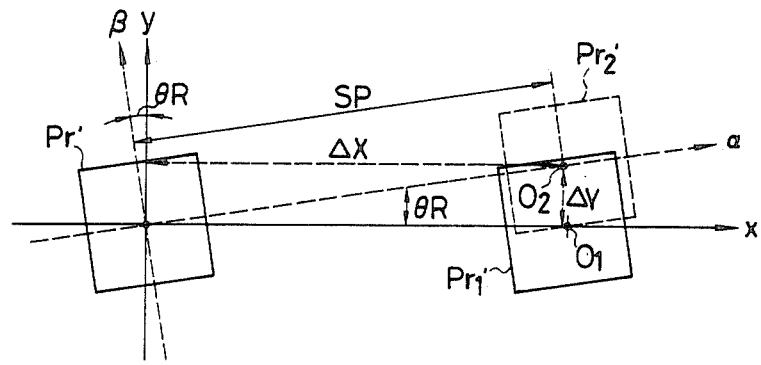
FIG. 12 is a schematic view showing the operation for correcting the reticle rotation.

As shown in FIG. 12, it is assumed that the projected image Pr' of the pattern area Pr of the reticle is inclined by the rotation θR to the x-y coordinate system. Consequently, if the exposure is repeated by simply stepping the wafer stage in the x- and y-directions under the assumption that the projected image Pr' contains no rotational error, the centers $O_1$ of projected images $Pr'_1$, etc. arranged in the x-direction on the wafer coincide exactly with the x-axis but respective projected images Pr', $Pr'_1$ contain rotational error. Thus, an orthogonal coordinate system αβ inclined by the rotation θR is determined, and the wafer stage is stepped along said coordinate system αβ. The images $Pr'_2$, etc. projected in this manner, including the projected image Pr', are rendered free from rotational error with respect to the coordinate system αβ. The coordinate system αβ represents plural local areas generated by matrix transfer of the same circuit pattern onto the wafer, namely the arrangement of chips. In the repeated exposures, the wafer stage is to be stepped from a current position to a next position distant by Δx, Δy, which are determined by following equations (3), (4) in case of stepping in the x-direction on the basis of a pitch SP of plural chips in the x-direction, or by equations (5), (6) in case of stepping in the y-direction on the basis of a pitch SP' of plural chips in the y-direction:

$$\Delta X = SP \cdot \cos \theta R = SP \quad (3)$$

$$\Delta Y = SP \cdot \sin \theta R = SP \cdot \theta R \quad (4)$$

$$\Delta X = SP' \cdot \sin \theta R = SP' \cdot \theta R \quad (5)$$

$$\Delta Y = SP' \cdot \cos \theta R = SP' \quad (6)$$

The CPU calculates in advance, according to these equations (3)–(6), the positions of chips in the x-y coordinate system so that the wafer stage is stepped along the coordinate system αβ on the wafer.

Step 207

Figure 13:
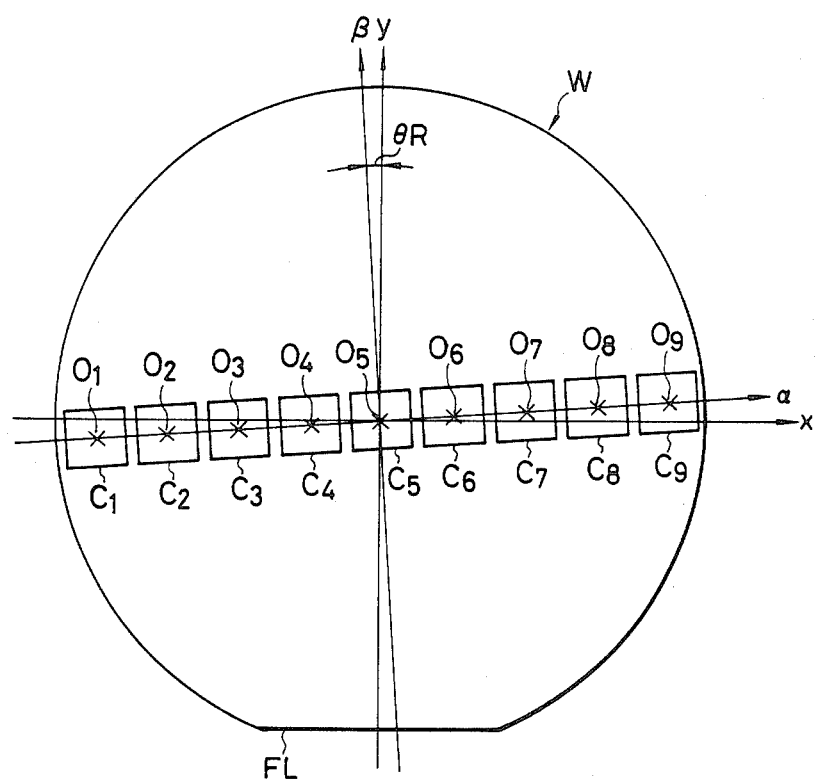
FIG. 13 is a plan view of the wafer on which the patterns of the first layer have been transferred.

Then the CPU causes the wafer stage to step according to the results of the above-mentioned calculation and projects the pattern of the reticle repeatedly with an actinic light, whereby chips are arranged on the wafer as shown in FIG. 13, which illustrates a particular array of chips in the x-direction under the assumption that the flat FL of the wafer W is parallel to the x-axis. The centers $O_1$–$O_9$ of the chips $C_1$–$C_9$ are all positioned on the α-axis, and each chip is free from rotation in the αβ-coordinate system.

Step 208

The wafer thus subjected to the exposure of the first layer is removed from the wafer holder 10 and fed to other process steps such as development. For exposing a second wafer of the lot, the CPU changes the wafer and executes the operations from the step 203 again. In the step 204, however, the CPU identifies that the wafer to be exposed is the second wafer of the lot and executes the step 207.

Figure 14:
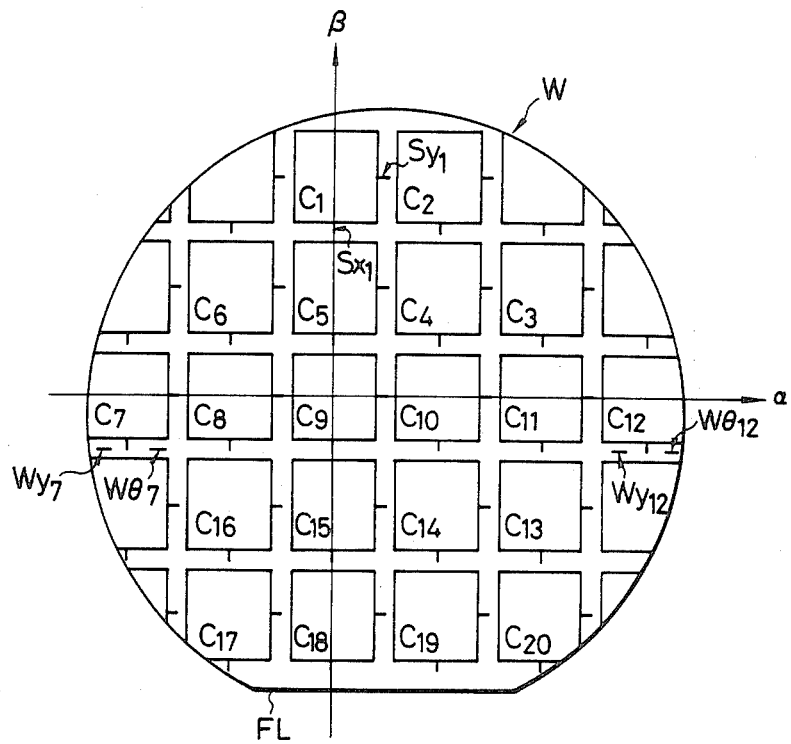
FIG. 14 is a plan view showing the arrangement of the chips and alignment marks on the wafer.
Figure 15:
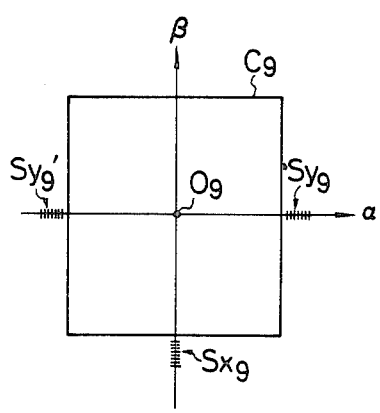
FIG. 15 is an enlarged view of a chip on the wafer.

As explained in the foregoing, the superposing operation is not required for the pattern of the first layer, so that the steps 203, 204, 207 and 208 are consecutively repeated unless the reticle R10 for the first layer is changed. The wafers thus exposed are subjected to the process for the first layer to form chips Cn (n=1, 2, 3, ...) in a matrix arrangement as shown in FIG. 14. Each of the chips Cn is formed by transfer of the pattern area Pr of the reticle R10 and is associated with the marks Sxn, Syn for laser step alignment and marks Wyn, W$\theta$n for wafer alignment. For the purpose of brevity, the marks Wyn, W$\theta$n are illustrated only as Wy7, W$\theta$7 and Wy12, W$\theta$12 associated with two chips C7, C12 positioned at left and right on the wafer. Also in FIG. 14, each chip is only associated with two marks Sxn, Syn in mutually orthogonal direction, but, as will be apparent from the pattern of the reticle R10, a mark Syn' is also provided in an opposed position to the mark Syn in the manner shown in FIG. 15. FIG. 15 is an enlarged view of a chip C9 positioned approximately in the center of the wafer and at the origin point of the $\alpha\beta$-coordinate system, wherein the marks Sy9 and Sy9' are formed on the $\alpha$-axis. Marks Wyn and W$\theta$n are formed in such a manner that either the distance between the marks Wy7 and W$\theta$12 or the distance between the marks W$\theta$7 and Wy12 is equal to the distance L between the light spots WYS and W$\theta$S of the off-axis W-MIC's 21, 22.

The above-described method of stepping the wafer stage in a direction inclined to the x-y coordinate system according to the reticle rotation in the exposure for the first layer is also extremely effective for a photorepeater not requiring superposed exposures, namely an exposure apparatus for preparing from a reticle, a working mask for use in a simultaneous exposure in a proximity or contact method.

Figure 16:
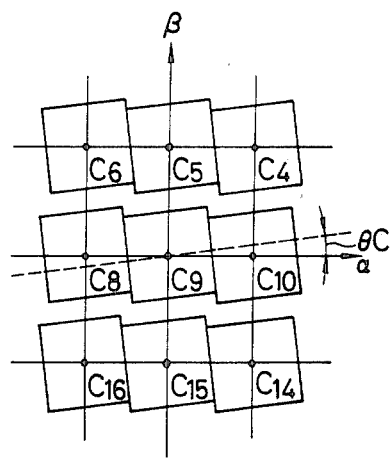
FIG. 16 is a schematic view showing the phenomenon of chip rotation.

The rotation of each chip with respect to the $\alpha$-$\beta$ coordinate system on the wafer (hereinafter called chip rotation) is theoretically eliminated by correcting the stepping position of the wafer stage according to the reticle rotation in the exposure for the first layer. In practice, however, the rotation does not necessarily become equal to zero, because of a deteriorated precision of the stepping or alignment due to a drift in the apparatus, or because of a positional aberration in the vacuum suction of the reticle stage to the support after the reticle alignment. Also in case the first layer is transferred in a separate exposure apparatus, one cannot be sure whether the chips have been arranged after the elimination of the chip rotation. Consequently, as shown in FIG. 16, each chip may carry a rotation $\theta$C though the centers of the chips are correctly arranged along the $\alpha$-$\beta$ coordinate system. It is therefore necessary in the superposed exposures for the second and ensuing layer, to measure and correct the chip rotation in addition to the reticle rotation.

Prior to the exposure of the second layer, a reticle for the second layer (reticle R shown in FIG. 6) is loaded in the exposure apparatus, and the steps 200-205 are executed in the aforementioned manner. For exposing the first wafer in a lot to the pattern of the second layer, there is executed a step 210 explained below:

Step 210

In this step there is conducted calibration (so-called paralleling) of the W-MIC's 21, 22. In cooperation with the WAC 65, the CPU so positions the wafer stage that the mark FMy of the reference mark plate 30 coincides with the light spot WYS of the W-MIC 21, then memorizes the y-coordinate value of the wafer stage in this state, and moves the wafer stage in the x-direction while maintaining the y-coordinate value unchanged, whereby the mark FMy of the reference mark plate 30 is positioned in the viewing field of the W-MIC 22. Then the halving glass 22b shown in FIG. 4 is adjusted by the WAC 65 in such a manner that the mark FMy coincides with the light spot W$\theta$S.

Through the foregoing operations, the line connecting the light spots WYS and W$\theta$S becomes exactly parallel to the x-axis.

Then the CPU positions the wafer stage in such a manner that the mark Wy7 of the wafer W shown in FIG. 14 is positioned in the viewing field of the W-MIC 21 and the mark W$\theta$12 is positioned in the viewing field of the W-MIC 22. Then it positions the wafer stage in the y-direction in such a manner that the light spot WYS coincides with the mark Wy7, and, while maintaining this state, rotates the wafer holder 10 in such a manner that the light spot W$\theta$S coincides with the mark W$\theta$12. In this manner the rotational error of the wafer with respect to the x-y coordinate system is eliminated, and the $\alpha$-$\beta$ coordinate system is aligned to the x-y coordinate system without rotational error. The CPU memorizes the count of the Y-counter of the laser interferometer 14 as the y-coordinate value Ygo when the light spot WYS coincides with the mark WY7, and so moves the wafer stage that the light spot SPx formed by the LSA system 18 coincides with the mark Sx9 of the chip C9 approximately in the center of the wafer. The position of the mark Sx9 is detected by the LSAC 62. More specifically, after the mark Sx9 and the light spot SPx are made parallel, the wafer stage is so moved in the x-direction by a determined amount that the mark Sx9 and the light spot SPx perform mutual scanning movement, and the intensity distribution of the diffracted light generated from the mark Sx9 is measured. For example the peak position of said intensity distribution, or the bisecting position in the x-direction or the center of gravity thereof is determined, and the wafer stage is returned to the thus determined position. In this manner the light spot SPx coincides exactly with the mark Sx9.

In this state the CPU memorizes the count of the X-counter of the laser interferometer 12 as the x-coordinate value Xgo. Through the foregoing operations the $\alpha$-$\beta$ coordinate system of the wafer is made to correspond to the x-y coordinate system. In this case, however, the $\alpha$-axis passes over the marks Wy7, W$\theta$7, Wy12, W$\theta$12 in contrast to the state shown in FIG. 14, but the $\alpha$-axis can be defined as shown in FIG. 14 by reducing, in the alignment operation with the W-MIC's 21, 22, the y-coordinate value Ygo read from the Y-counter by a distance between the marks Syn (Syn') and Wyn (W$\theta$n) in the $\beta$-direction.

Thus, by positioning the wafer stage in such a manner that the counts of the X- and Y-counters become respectively equal to the memorized coordinate values Xgo and Ygo, the optical axis AX or the projected point of the center RC of the reticle coincides with the center O9 of the chip C9, which is the origin point of the $\alpha$-$\beta$ coordinate system. The global alignment of the wafer is completed in this manner.

Step 211

The CPU measures the aforementioned chip rotation $\theta C$ by detecting the positional aberration, in the y-direction, of the marks Syn, Syn' formed on both sides of each chip on the wafer by means of the light spot SPy from the LSA system. At first the CPU so moves the wafer stage that the light spot SPy scans the mark Sy9 of the chip C9 at the approximate center of the wafer in the y-direction, and memorizes the count of the Y-counter as the y-coordinate value Y3 when the light spot SPy coincides with the mark Sy9. Then it so moves the wafer stage in the x-direction that the light spot SPy becomes arranged parallel to the mark Sy9'. The amount of said movement is equal to the distance of the marks Sy9 and Sy9', which is represented as a count PX in the X-counter of the laser interferometer 12. Then the CPU scans the mark Sy9' with the light spot SPy in the y-direction, and memorizes the count of the Y-counter as the y-coordinate value Y4 when the light spot SPy coincides with the mark Sy9'. Based on these measurements, the CPU calculates the chip rotation $\theta C$ from an equation (7) in which the chip rotation $\theta C$ is approximated because it is very small:

$$\theta C \simeq \sin^{-1}\left(\frac{Y_3 - Y_4}{PX}\right) = \frac{Y_3 - Y_4}{PX} \qquad (7)$$

For improving the accuracy, the chip rotation is preferably measured on plural chips positioned close to the center of the wafer and is averaged.

Step 212

Then the CPU effects the global alignment of the wafer again in such a manner as to incline the wafer, with respect to the x-y coordinate system, by a difference $\Delta\theta$ between the rotation $\theta R$ of the reticle R for the second layer and the chip rotation $\theta C$. Said re-alignment can be achieved in two ways, either through the use of the marks Wy, W$\theta$ on the wafer or through the use of the mark FMy of the reference mark plate 30. In the former case, the CPU cooperates, as in the foregoing step 203, with the WAC 65 to position the two-dimensionally movable stage in such a manner that the light spot WYS of the W-MIC 21 coincides with the mark Wy7 and the light spot W$\theta$S of the W-MIC 22 coincides with the mark W$\theta$12.

Then, based on the distance L between the light spots WYS and W$\theta$S and the rotation $\Delta\theta$, the CPU calculates an aberration $\Delta YC$ in the y-direction between the marks Wy7 and W$\theta$12 generated when the wafer is inclined by $\Delta\theta$ with respect to the x-y coordinate system by means of an equation (8), in which an approximation is employed for a very small value of $\theta C$:

$$\Delta YC \simeq L \cdot \sin(\theta C - \theta R) = L \cdot (\theta C - \theta R) \qquad (8)$$

The reticle rotation is considered positive if anticlockwise in the x-y coordinate system, and the chip rotation is considered positive if anticlockwise in the $\alpha$-$\beta$ coordinate system. Then the CPU moves the wafer stage by said aberration $\Delta YC$ in the y-direction, which is positive or negative according to the result of calculation $(\theta C - \theta R)$. It is assumed that the wafer stage is moved in the negative y-direction by $\Delta YC$ if $(\theta C - \theta R)$ is positive. Then the CPU controls the WAC 65 to rotate the halving glass 22b in the W-MIC 22, thereby displacing the light spot W$\theta$S in the direction of movement by $\Delta YC$ of the two-dimensionally movable stage. The rotation of the halving glass 22b is terminated when the WAC 65 detects that the light spot W$\theta$S coincides with the mark W$\theta$12.

On the other hand, in case of using the mark FMy, the wafer stage is at first so positioned that the mark FMy coincides with the light spot WYS. Then the wafer stage is moved in parallel manner in the x-direction by a distance L and in the y-direction by the aberration $\Delta YC$ according to the equation (8). Subsequently the halving glass 22b is so rotated that the light spot W$\theta$S coincides with the mark FMY.

Through the foregoing operations, the line connecting the light spots WYS and W$\theta$S is adjusted to a position inclined to the x-axis by a rotation $\Delta\theta$. Then the CPU slightly moves the two-dimensionally movable stage in the y-direction and slightly rotates the wafer holder 10, as in the foregoing step 203, in such a manner that the mark Wy7 coincides with the light spot WYS and the mark W$\theta$12 coincides with the light spot W$\theta$S, whereby the $\alpha$-$\beta$ coordinate system of the wafer is aligned to a position inclined by the rotation $\Delta\theta$ with respect to the x-y coordinate system. In addition the relative rotational error between the projected image Pr' of the reticle and the corresponding chip on the wafer is eliminated.

Figure 17:
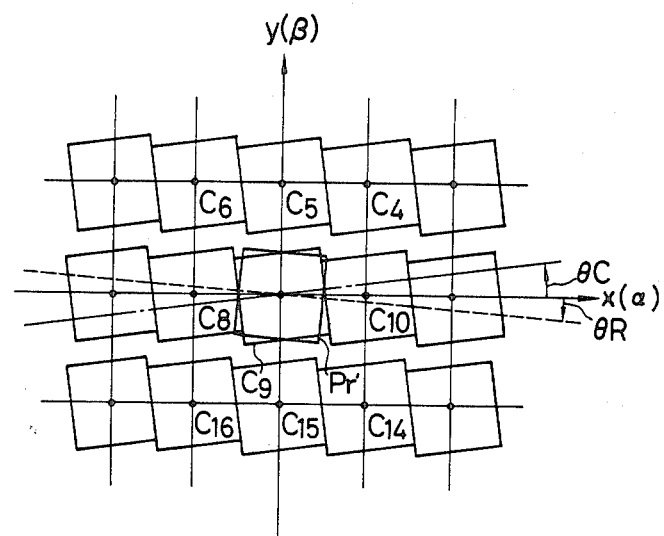
FIG. 17 is a schematic view showing the relationship between the chip rotation and reticle rotation.
Figure 18:
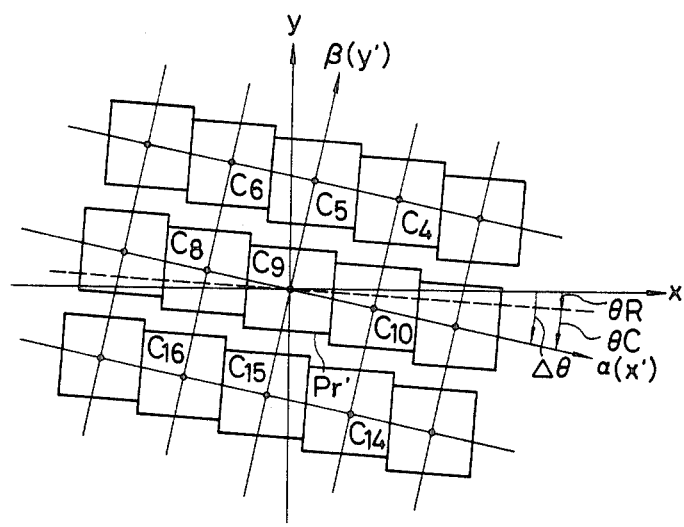
FIG. 18 is a schematic view showing the correction of the chip rotation and reticle rotation.

The foregoing operations will be more fully understood from FIGS. 17 and 18. FIG. 17 shows a state in which the $\alpha$-$\beta$ coordinate system of the wafer W is made to coincide with the x-y coordinate system and the projected image Pr' of the pattern for the second layer is superposed on the chip C9. The projected image Pr' is rotated by $\theta R$ in the negative direction with respect to the x-y coordinate system because of the reticle rotation, and each chip Cn is rotated by $\theta C$ in the positive direction with respect to the x-y ($\alpha$-$\beta$) coordinate system because of the chip rotation. The re-alignment of the wafer according to rotations $\theta R$ and $\theta C$ brings the $\alpha$-$\beta$ coordinate system to a position inclined by $\Delta\theta$ to the x-y coordinate system, and the relative rotational error between the projected image Pr' and the chip C9 is cancelled. In the step-and-repeat exposures, therefore, each chip can be exposed without rotational error by stepping the wafer stage not along the x-y coordinate system but along an x'-y' coordinate system which is inclined by $\Delta\theta$ to the x-y coordinate system and which coincides with the $\alpha$-$\beta$ coordinate system in FIG. 18.

Step 213

Then the CPU calculates the amounts of correction in the same manner as in the foregoing equations (3)–(6). More specifically, in case of exposing in succession the chips arranged along the $\alpha$ (X') axis on the wafer, the stepping distance $\Delta x$ and $\Delta y$ to a neighboring chip is calculated by equations (9) and (10), and, in case of exposing in succession the chips arranged along the $\beta$ (y') axis, the stepping distance $\Delta x$, $\Delta y$ is calculated by equations (11), (12):

$$\Delta X = SP \cdot \cos(\Delta\theta) = SP \qquad (9)$$

$$\Delta Y = SP \cdot \sin(\Delta\theta) = SP \cdot \Delta\theta \qquad (10)$$

$$\Delta X = SP' \cdot \sin(\Delta\theta) = SP' \cdot \Delta\theta \qquad (11)$$

$$\Delta Y = SP' \cdot \cos(\Delta\theta) = SP' \qquad (12)$$

wherein SP is the pitch of arrangement of chips in the $\alpha$-direction, and SP' is that in the $\beta$-direction.

Step 207

The CPU steps the wafer stage according to the stepping distance Δx, Δy calculated in the step 213 to expose each chip on the wafer to the projected image Pr' of the second layer. In this manner a more precise superposing without reticle rotation and chip rotation is achieved in each chip of the wafer.

Step 208

The wafer thus exposed is removed from the wafer holder 10 of the apparatus. In the exposing operation for the next wafer, i.e. the second wafer in the lot, the CPU repeats the above-described procedure from the step 203. However, in a step indicated by a broken line between the steps 204 and 207, there is conducted the global alignment in which the light spots WYS, WθS of the W-MIC's adjusted in the step 212 are brought to the marks Wyn, Wθn and the light spot SPx of the LSA system 18 is brought to the mark Sxn. In this manner, for the second and ensuing wafers in a lot, the exposure process is conducted in the order of the steps 203, 204, 210, 207 and 208. Also when the last wafer in a lot has been processed, the CPU removes the wafer and repeats the procedure from the step 200 in response to the identification in the step 209.

In the foregoing explanation, the step 207 merely moves the wafer stage stepwise but does not perform alignment by the marks on the wafer. However, in case there occurs a run-out (elongation or contraction) of the wafer, the precision of superposing is deteriorated because the pitch of chip arrangement on the wafer becomes different from the designed value. It is therefore preferable, in stepping the wafer stage to align the projected image Pr' with the chip Cn, to scan the marks Sxn, Syn around the chip with the light spots SPx, SPy of the laser step alignment systems to determine the aberration of the chip with respect to the projected position of the projected image Pr', and to effect fine adjustment of the wafer stage so as to reduce said aberration to zero. Such alignment on a chip may be conducted for every stepping of the wafer stage (step alignment), or for certain chips on the wafer in which case the positioning for other chips is made only by the stepping of the wafer stage (block alignment). Also if a linear mark for matching the mark RS of the reticle is formed on each chip on the wafer, it becomes possible, after the correction of the coordinate system by Δθ, to detect the matching of said linear mark and the mark RS through the DDA system 20 and the DDAC 64 and to effect the die-by-die step alignment or the block alignment, thus eliminating the minute positional aberration. In an exposure apparatus principally relying on such die-by-die alignment, the wafer stage may be simply stepped along the x- and y-axes at the exposure after the correction of the reticle rotation and chip rotation, namely after the reticle and the wafer are arranged as shown in FIG. 18. In the state shown in FIG. 18, if the wafer is stepped in the negative x-direction by the pitch SP to project the image Pr' of the pattern area Pr on the chip C10, the positional aberrations in the x- and y-directions therebetween remain while the rotational aberration therebetween is eliminated. Said positional aberrations can be easily eliminated by fine adjustment of the wafer stage in the die-by-die alignment.

In the above-described first embodiment of the present invention, it is possible also to reduce the reticle rotation eventually to zero by effecting the steps 200, 201 and 202 plural times in suitable combination. For this purpose a halving glass as shown in FIG. 4 is provided in the optical system of the R-MIC 17 shown in FIG. 1, thereby enabling a slight movement, in the y-direction, of the image 17a of the index mark of the R-MIC 17 shown in FIG. 10. After the reticle rotation θR is determined in the steps 200, 201 and 202, the halving glass of the R-MIC 17 is rotated to move the image 17a of the index mark slightly in the y-direction. More specifically this operation is achieved by moving the reference mark 30y of the reference mark plate 30 from the projected position of the image 16a of the index mark of the R-MIC 16 to the projected position of the image 17a of the index mark, then further moving the reference mark 30y in the y-direction by an amount −θR and rotating the halving glass so as to bring the image 17a of the index mark to the reference mark 30y. Then the reticle alignment is conducted again, using thus adjusted image 17a of the index mark of the R-MIC and image 16a of the index mark of the R-MIC 16. After said alignment, the reticle rotation θR is measured again, and the step 203 is executed if said rotation θR is found to be in a range predetermined in relation to the precision of the detecting system and of the mechanisms. If otherwise the halving glass of the R-MIC 17 is adjusted again. The reticle rotation θR is eventually reduced to an extremely small value by repeating the above-described procedure until a desired precision is obtained. However such procedure requires additional time for random positional error and lengthens the overall time for reticle alignment.

Consequently a faster process can be realized by measuring the reticle rotation only once as in the foregoing embodiment and thereafter correcting the rotational aberration by the rotation of the wafer and of the stepping coordinate system. Naturally the above-explained reticle alignment is effective in case the reticle is scarcely exchanged.

In the following there will be explained a second embodiment of the present invention. In the foregoing embodiment the chip rotation is detected by measuring the displacements of the marks Syn, Syn' on both side of the chip in the y-direction by means of the light spot SPy of the laser step alignment system. In this second embodiment the chip rotation is measured by detecting the marks on both sides of the chip by the movement of the wafer stage, through the DDA system 20 and DDAC 64, with the reticle mark RS as the reference window. The procedure of said measurement will be explained in the following in relation to FIG. 19. At first a global alignment is effected on the wafer by the W-MIC's 21, 22 so as that the α-β coordinate system coincides with the x-y coordinate system. Then a chip C in the approximate center of the wafer is positioned directly under the projection lens 1 by means of the precision of the global alignment and of the stepping of the wafer stage. Observation through the DDA system 20 detects the reticle mark RS and a linear mark DM1 extending in the x-direction to the right of the chip C. Thus, the DDAC 64 detects the positional aberration ΔYM1, in the y-direction, of the mark RS with respect to the edges Rs1, Rs2 (shown in FIG. 7). Subsequently the wafer stage is moved in the x-direction without change in the y-coordinate value, then a linear mark DM2 extending in the x-direction to the left of the chip C is observed by the DDA system 20 together with the mark RS and the positional aberration in the y-direction of the mark DM2 with respect to the mark RS is determined by the DDAC 64. As the distance LD between the marks DM1 and DM2 is predetermined in designing, the chip rotation $\theta C$ is approximately obtained from an equation (13):

$$\theta C \simeq \frac{\Delta YM1 - \Delta YM2}{LD} \quad (13)$$

If the DDA system 20 is so designed as to illuminate the reticle mark RS with light of a wavelength the same as that of the exposing light, said illuminating light has to be intercepted during the movement of the wafer stage in the x-direction.

Figure 20:
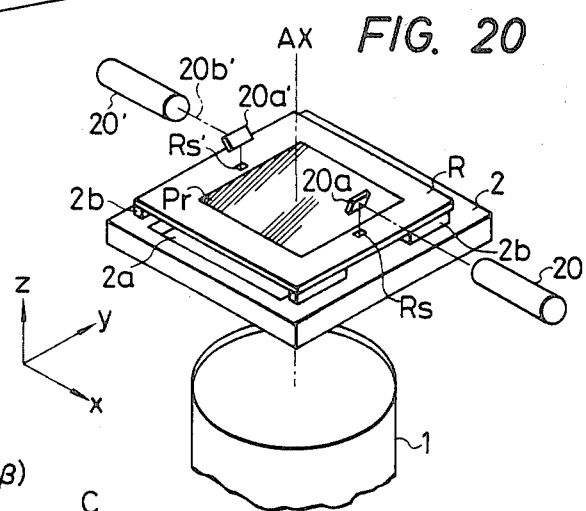
FIG. 20 is a perspective view schematically showing an essential part of an exposure apparatus of a third embodiment of the present invention.
Figure 21:
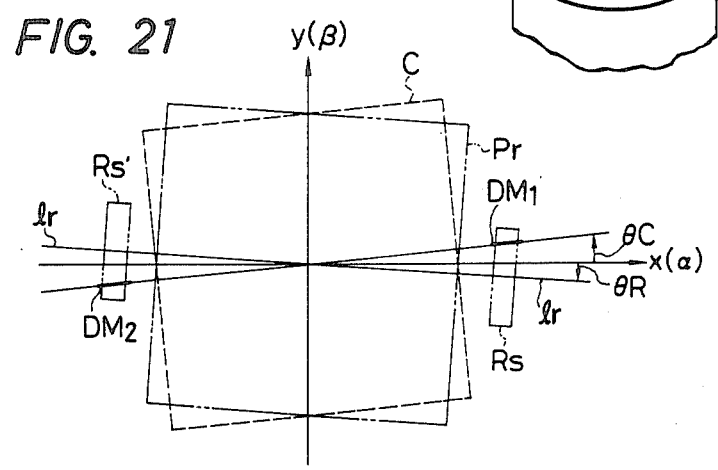
FIG. 21 is a schematic view showing the measurement of chip rotation in the structure shown in FIG. 20.

Now reference is made to FIGS. 20 and 21 for explaining a third embodiment of the present invention. In the foregoing embodiments the reticle rotation $\theta R$ and the chip rotation $\theta C$ are separately measured and the differential rotation $\Delta\theta$ is determined by calculation. In the third embodiment the rotation $\Delta\theta$ is directly detected without said calculation. FIG. 20 is a partial view of the reticle stage 2 of the projection exposure apparatus shown in FIG. 1, wherein the same components as those in FIG. 1 are represented by the same numbers. In the present embodiment, a die-by-die alignment system composed of a DDA system 20' and a mirror 20a' respectively the same as the DDA system 20 and the mirror 20a are provided in rotary symmetric positions about the optical axis AX. The reticle R is provided with a window-shaped mark RS' similar to and positioned opposite to the mark RS across the pattern area Pr. The DDA system 20' observes the image of the mark RS' reflected by the mirror 20a' and the marks on the wafer through the projection lens.

The use of two DDA systems 20, 20' allows dispensing with the step 202 for the reticles of the second and ensuing layers, and allows in the step 211 direct measurement of the rotation $\Delta\theta$, as will be explained in the following in relation to FIG. 21. After parallelling of the W-MIC's 21, 22 with the reference mark plate 30, wafer alignment is conducted to match the marks Wy7, W$\theta$12 on the wafer respectively with the light spots WYS, W$\theta$S, whereby the rotational error between the $\alpha$-$\beta$ coordinate system of the chip C on the wafer and the x-y coordinate system is eliminated. FIG. 21 shows such state where the $\alpha$-$\beta$ coordinate system coincides with the x-y coordinate system, in which it is assumed that the chip C has been rotated by $\theta C$ in the positive direction while the pattern area Pr of the reticle has been rotated by $\theta R$ in the negative direction for achieving mutual overlapping. Then the wafer stage is so adjusted in the y-direction, without changing the x-coordinate value, that the mark DM1 at the right side of the chip C is positioned in the center, i.e. on a line lr, between the edges Rs1, Rs2 of the mark RS.

In this state the CPU memorizes the y-coordinate value Y1 of the wafer stage. Then the wafer stage is so adjusted in the y-direction, without changing the x-coordinate value, that the mark DM2 at the left side of the chip C is positioned in the center, i.e., on a line lr, of the mark Rs', and the CPU memorizes the y-coordinate value Y2. The CPU 60 calculates $\Delta\theta$ according to an equation (15) in an approximation that the distance between the marks RS and RS' on the wafer is equal to the distance LD between the marks DM1 and DM2, and the rotations $\theta C$ and $\theta R$ are both very small:

$$\Delta\theta \simeq \frac{Y_1 - Y_2}{LD} \quad (15)$$

After the determination of the rotation, $\Delta\theta$, the wafer is inclined by $\Delta\theta$ to the x-y coordinate system as in the first embodiment, and the step-and-repeat exposures are conducted along the $\alpha$-$\beta$ coordinate system thus inclined by $\Delta\theta$.

In case the DDAC 64 has a function of determining the aberration between the marks RS (RS') and DM1 (DM2), the rotation $\Delta\theta$ can be calculated from a similar equation $\Delta\theta = (\Delta Y_1 - \Delta Y_2)/LD$ by detecting the aberration of the mark DM1 (DM2) in the y-direction with respect to the center (line lr) of the mark RS (RS'), said aberration being measured as negative or positive around said line lr. In this manner, if the control circuit for the DDAC 64 has a function of detecting the aberration, a faster measurement is rendered possible without the necessity for fine movement of the wafer stage for the measurement of the chip rotation.

Furthermore, the use of two marks RS, RS' on both sides of the pattern area Pr as in the present embodiment enables measurement of the reticle rotation even after the reticle alignment. More specifically, the rotation $\theta R$ is measured by matching the reticle mark RS with the mark 30y of the reference mark plate 30, then moving the wafer stage in the x-direction, without changing the y-coordinate value, to enable observation of the mark RS' and mark 30y through the DDA system 20', and determining the aberration between the marks RS' and 30y in the y-direction.

Figure 22:
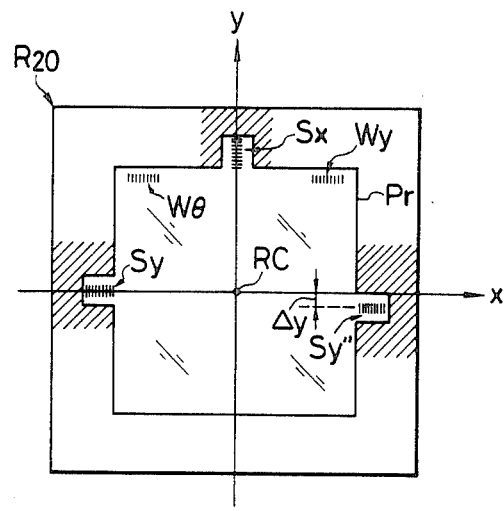
FIG. 22 is a plan view of a reticle for transferring the pattern of a first layer.

FIG. 22 shows another embodiment of the reticle R20, which is provided, in the same manner as in the reticle R10 shown in FIG. 11, with marks Wy, W$\theta$, Sx, Sy and Sy" for transferring the circuit pattern of the first layer onto the wafer, wherein the mark Sy" is offset by $\Delta y$ in the y-direction from the x-axis. The mark Sy is exclusively used for detecting the wafer position in the y-direction, and the marks Sy and Sy" are used in cooperation for the measurement of chip rotation on the wafer.

The pattern transfer of the first layer with said reticle R20 is conducted in a similar manner as the flow chart shown in FIG. 9.

Figure 23:
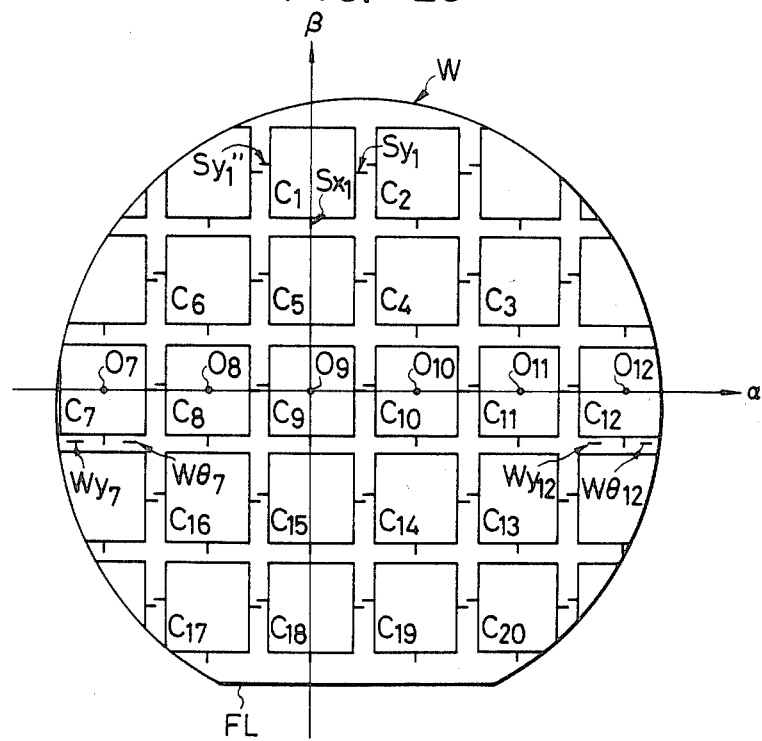
FIG. 23 is a plan view showing the arrangement of chips and alignment marks on the wafer.

As shown in FIG. 23, the wafer W after the transfer of the first layer by the reticle R20 bears the chips along the $\alpha$-$\beta$ coordinate system. It is assumed that the wafer flat FL is parallel to the $\alpha$-axis. The chips are formed in succession by stepwise exposures along the $\alpha$-direction, and the mark Sy (or Sy") of a preceding chip exposed in a preceding exposure and the mark Sy" (or Sy) of a succeeding chip are arranged in the $\beta$-direction.

Figure 24:
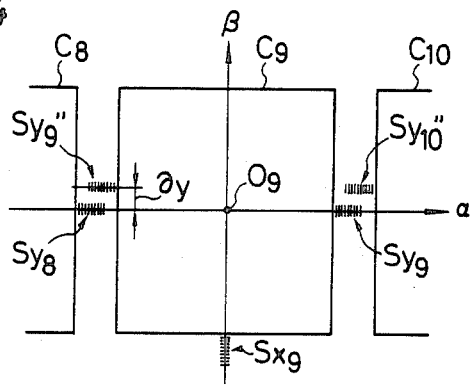
FIG. 24 is an enlarged view of a chip on the wafer.

FIG. 24 is an enlarged view of a chip C9 at the origin point of the $\alpha$-$\beta$ coordinate system at the approximate center of wafer, wherein the mark Sx9 is formed on the $\beta$-axis while the mark Sy9 is formed on the $\alpha$-axis, and the mark Sy"9 is formed with an offset $\Delta y \cdot m$ in the $\beta$-direction from the $\alpha$-axis. The symbol m stands for the ratio of reduction of the projection lens 1, and $\Delta y \cdot m$ represents the offset $\delta y$ on the wafer corresponding to the off-set $\Delta y$ on the reticle R20. Thus, when the centers O9, O8 and O10 of the chip C9 and two neighboring chips C8, C10 are positioned on the $\alpha$-axis, the marks Sy8, Sy"9 are spaced by said offset $\delta y$ in the $\beta$-direction, and the marks Sy9, Sy"10 are spaced by the offset $\delta y$ in the $\beta$-direction.

Prior to the exposure of the pattern of the second layer on the wafer bearing the patterns of the first layer, the chip rotation is determined as in the foregoing embodiments. In the present embodiment, however, the equation (7) is modified as follows:

$$\theta C \approx \sin^{-1} \frac{Y_3 - (Y_4 - \delta y)}{PX} \approx \frac{Y_3 - (Y_4 - \delta y)}{PX} \quad (16)$$

The exposures of the second and ensuing layers are thereafter conducted in the similar steps as explained before. The structure of the reticle R20 in the present embodiment allows reducing the space required for the marks of for measurement of the chip rotation between the neighboring chips and thus increasing the number of chips to be accommodated in a wafer, since the marks formed between the neighboring chips and respectively associated therewith are mutually offset in the y-direction even though they mutually overlap in the x-direction.

The amount of offset $\Delta y$ in the y-direction between the marks Sy and Sy'' on the reticle R20 is determined according to the possible maximum value of the chip rotation, and should preferably be as small as possible because of the following reason. When the marks Sy, Sy'' of the reticle R20 are transferred onto the wafer, and if a clockwise rotation is present in the chip C9 shown in FIG. 24, the mark Sy9 which should originally be positioned on the α-axis is displaced in the −β-direction, and the mark Sy9'' is displaced in the β-direction from the α-axis. Consequently the distance between the marks Sy8 and Sy9' and the distances between the marks Sy9 and Sy10'' become larger but the positions of these marks are still detectable as explained before. However if said chip rotation is anticlockwise and becomes large, the mark Sy9 is displaced in the β-direction with respect to the α-axis while the mark Sy9'' is displaced in the −β-direction with respect to the α-axis, so that these two marks come closer and eventually overlap each other. In the extreme case the positions of these two marks may become inverse in the β-direction. In these circumstances the detection of the mark positions becomes inaccurate and the result of measurement of the chip rotation becomes unreliable. It is therefore desirable to determine the amount of offset $\Delta y$ in such a manner that the two marks between two neighboring chips are not inverted and are sufficiently distinguishable even for a maximum anticipated chip rotation.

As explained in the foregoing, the amount of offset δy between a pair of marks Syn, Syn'' associated with a chip is determined as the amount of offset $\Delta y$ between the marks Sy, Sy'' on the reticle R20, in consideration of the maximum anticipated chip rotation. Naturally a condition $\Delta y > dn$ should be satisfied, wherein dn is the width of the marks Sy, Sy'' in the y-direction, and $\Delta y$ is the amount of offset defined as the distance between a central line of the mark Sy parallel to the x-axis in FIG. 22 and a central line of the mark Sy'' parallel to the x-axis. In addition the optimum value of offset is determined, in consideration of the detecting ability of the laser step alignment system and die-by-die alignment system and of the interference of photoresist, in such a manner that two parallel marks on the wafer can be photoelectrically separated with a sufficient precision even in the presence of a chip rotation. As an example, an offset of 20 microns is sufficient for the purpose. On the other hand, there is no theoretical upper limit in said offset, but the time required for the measurement of chip rotation becomes longer as the amount of offset increases.

Figure 19:
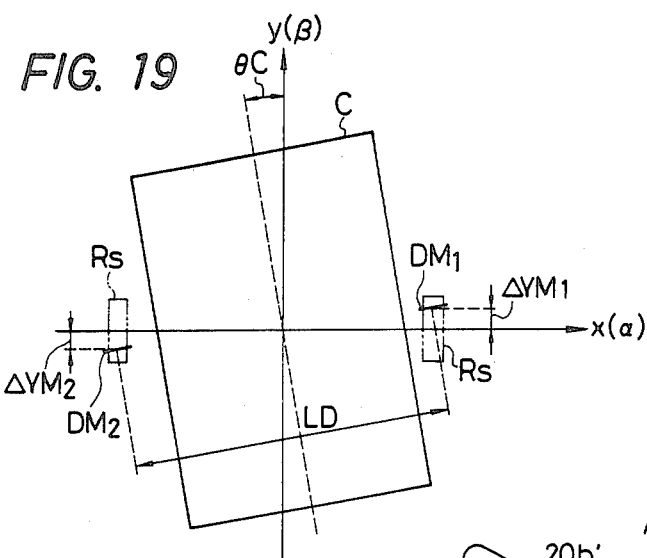
FIG. 19 is a schematic view showing the measurement of chip rotation according to a second embodiment of the present invention.
Figure 25:
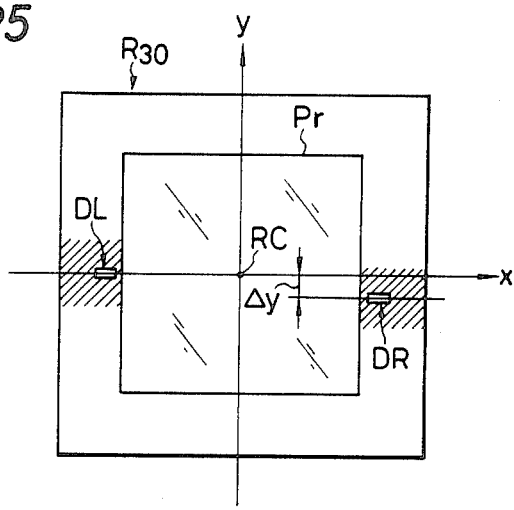
FIG. 25 is a plan view of a reticle for a first layer according to still another embodiment.

For measuring the chip rotation by the DDA system 20 and DDAC 64 in the same manner as shown in FIG. 19, an image of a reticle R30 as shown in FIG. 25 is projected on the wafer to form the first layer. The reticle R30 is provided with a linear marks DL, DR measuring chip rotation extending in the x-direction on both sides of the pattern area Pr. When said reticle is loaded on the exposure apparatus without rotational error to the x-y coordinate system, the mark DL is positioned on the x-axis while the mark DR is positioned parallel to the x-axis and distant therefrom by the offset $\Delta y$.

Consequently the pattern of the first layer on the wafer has a chip arrangement the same as that shown in FIG. 23. For the second and ensuing layers, the positional aberrations of the marks can be determined by observing the marks of the chips on the wafer by an imaging tube 54 of the DDA system 20 through the transparent window RS (see FIG. 6) of each reticle.

The chip rotation $\theta C$ can be determined also by measuring the distance, in the y-direction, of two marks positioned between two neighboring chips, instead of using two marks formed on both sides of each chip.

Figure 26:
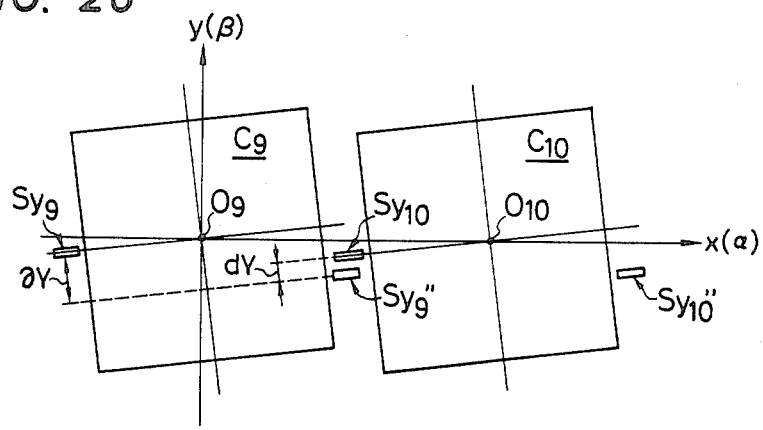
FIG. 26 is a schematic view showing the measurement of chip rotation.

FIG. 26 shows two chips C9, C10 in the approximate center of the wafer, wherein the α-β coordinate system on the wafer coincides with the x-y coordinate system. If the chips C9, C10 have no rotation, the marks Sy9, Sy10 are positioned on the x (α) axis, and the distance dY in the y-direction between the marks Sy9'' and Sy10 positioned between the chips C9, C10 becomes equal to the offset value δY predetermined in the designing. However, if the chips C9, C10 are rotated anticlockwise as illustrated, the mark Sy9'' associated with the chip C9 is displaced in the −y-direction, while the mark Sy10 associated with the chip C10 is displaced in the −y-direction from the original position on the x-axis, whereby said distance dY becomes smaller than the originally designed offset value δY. On the other hand, if the chips C9, C10 are rotated clockwise, the distance dY becomes larger than the offset value δY. In addition the difference between the distance dY and the offset value δY corresponds to the rotation $\theta C$, which can therefore be calculated in approximation by an equation (17):

$$\theta C \approx \sin^{-1} \frac{\delta Y - dY}{LD} \approx \frac{\delta Y - dY}{LD} \quad (17)$$

In this manner the direction and amount of chip rotation can be immediately determined by detecting the positions in the y-direction of two marks positioned between two neighboring chips and measuring the distance dY therebetween. It is naturally possible to improve the precision by measuring the distance dY on paired marks in plural positions and averaging the obtained results. In case the distance dY between two marks positioned between two neighboring chips is smaller than the distance between edges RS1, RS2 of the reticle mark RS, said distance dY can be detected by the DDA system 20 so that the wafer stage needs only to be moved in the x-direction by the pitch of the chip arrangement at the measurement of rotation. It is therefore possible to improve the precision of measurement and to reduce the time required for measurement.

What is claimed is:

1. An apparatus for successively aligning a first pattern formed on a photomask with a plurality of identical second patterns formed, according to a prescribed arrangement, on a substrate, comprising:

stage means adapted for supporting said substrate and movable two-dimensionally along the face of said substrate;

means for detecting relative rotational error between said first pattern and at least one of said plurality of second patterns;

means for causing relative rotation between said photomask and said substrate in order to compensate the relative rotational error detected by said detecting means and to correct the rotational aberrations of each of said second patterns; and means for controlling the movement of said stage means according to said prescribed arrangement so as to align said first pattern with each of said second patterns successively.

2. An apparatus according to claim 1, wherein said relative rotation causing means rotates said substrate relative to said photomask by an angle corresponding to said relative rotational error.

3. An apparatus according to claim 2, wherein said second patterns are arranged along a coordinate axis on said substrate and said control means has means for moving said stage means along said coordinate axis.

4. An apparatus according to claim 1, wherein said second patterns are arranged along a coordinate axis on said substrate and each of said second patterns has a pair of reference marks which are mutually spaced in the direction of said coordinate axis.

5. An apparatus according to claim 4, wherein said pair of reference marks are offset mutually in a direction perpendicular to said coordinate axis.

6. An apparatus according to claim 1, wherein said detecting means includes first mark means having at least a pair of reference marks provided on said photomask, second mark means having at least a pair of reference marks provided on said substrate, observation optical means for observing said first and second mark means, and means for determining relative rotation between said first pattern and said one of second patterns according to said observation optical means.

7. An apparatus according to claim 6, wherein said pair of reference marks of said first mark means are disposed in a determined positional relationship about said first pattern and said pair of reference marks of said second mark means are disposed in a determined positional relationship about said second patterns.

8. An apparatus according to claim 7, wherein said observation optical means includes a first optical system adapted to be used for observing said first mark means and a second optical system adapted to be used for observing said second mark means.

9. An apparatus according to claim 6, further comprising projection optical means disposed between said photomask and said substrate, and wherein said photomask and said substrate are conjugate with each other relative to said projection optical means, and said observation optical means having an observation field in which said first mark means and an image of said second mark means projected on said photomask are arranged.

10. An apparatus for successively aligning a first pattern formed on a photomask with a plurality of identical second patterns formed on a substrate at a determined pitch, comprising:

means for supporting said photomask, said photomask having means for indicating a reference direction of said first pattern;

stage means for supporting said substrate and capable of two-dimensional movement with said substrate, said substrate having means for indicating respective directions of said second patterns corresponding to said reference direction of said first pattern;

means for detecting relative rotational error of the direction of at least one of said second patterns relative to said reference direction of said first pattern;

means for rotating said substrate relative to said photomask in order to compensate the relative rotational error detected by said detecting means and to correct the rotational aberrations of each of said second patterns;

means for determining a coordinate system on said substrate provided with a corrdinate axis corresponding to said reference direction of said first pattern and determining positions of said second patterns along said coordinate system on said substrate compensated by said rotating means; and means for moving said stage means in response to said determining means.

11. An apparatus according to claim 10, wherein each of said second patterns has a pair of reference marks which are mutually spaced in the direction of said pitch.

12. An apparatus according to claim 11, wherein said pair of reference marks are offset mutually in a direction perpendicular to said direction of said pitch.

13. An apparatus according to claim 10, wherein said indicating means of said photomask includes first mark means having at least a pair of reference marks, said indicating means of said substrate includes second mark means having at least a pair of reference marks, and said detecting means includes observation optical means for observing said first and second mark means and means for determining relative rotation between said first pattern and said second pattern according to said observation optical means.

14. An apparatus according to claim 13, wherein said pair of reference marks of said first mark means are disposed in a determined positional relationship about said first pattern and said pair of reference marks of said second mark means are disposed in a determined positional relationship about said second patterns.

15. An apparatus according to claim 10 wherein said observation optical means includes a first optical system adapted to be used for observing said first mark means and a second optical system adapted to be used for observing said second mark means.

16. A method for successively aligning a first pattern formed on a photomask with plural second patterns formed on a substrate along a reference direction, comprising the steps of:

(a) positioning said photomask on a first stage and said substrate on a second stage;

(b) detectinng rotational error $\theta C$ which each of said second patterns has relative to said reference direction;

(c) rotating said substrate relative to said photomask by an angle corresponding to said rotational error $\theta C$ and to correct the rotational aberrations of each of said second patterns; and (d) moving said second stage along said reference direction so as to align said first pattern with each of said second patterns successively.

17. In an apparatus for printing a pattern of a photomask onto a substrate, the apparatus having a fiducial mark, an illumination optical system having a position controllable reference mark and a holder for holding said photomask, a method for carrying out an alignment of said photomask with said apparatus comprising steps of:

(a) aligning the reference mark of said illumination optical system with said fiducial mark;

(b) displacing said holder to align said photomask with the aligned reference mark;

(c) fixing the displaced holder to said apparatus;

(d) detecting an amount of rotational error of the photomask on the fixed holder with respect to the apparatus;

(e) adjusting the position of said reference mark in correspondence with said amount of rotational error to correct said rotational error;

(f) re-displacing said holder to align said photomask with the adjusted reference mark; and (g) fixing the re-displaced holder to said apparatus.

* * * * *